United States Patent
Boyd et al.

(10) Patent No.: US 8,519,461 B2
(45) Date of Patent: Aug. 27, 2013

(54) DEVICE WITH POST-CONTACT BACK END OF LINE THROUGH-HOLE VIA INTEGRATION

(75) Inventors: John Boyd, Woodlawn (CA); Fritz Redeker, Fremont, CA (US); Yezdi Dordi, Palo Alto, CA (US); Hyungsuk Alexander Yoon, San Jose, CA (US); Shijian Li, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/455,453

(22) Filed: Apr. 25, 2012

(65) Prior Publication Data

US 2012/0205807 A1    Aug. 16, 2012

Related U.S. Application Data

(62) Division of application No. 12/613,518, filed on Nov. 5, 2009, now Pat. No. 8,187,968, which is a division of application No. 11/820,811, filed on Jun. 20, 2007, now Pat. No. 7,615,480.

(51) Int. Cl.
*H01L 21/02* (2006.01)

(52) U.S. Cl.
USPC ........... 257/296; 257/306; 257/686; 257/672; 257/E21.585; 257/E23.145

(58) Field of Classification Search
USPC ................. 257/296, 306, 347, 686–672, 774, 257/E21.585, E23.145
See application file for complete search history.

(56) References Cited

U.S. PATENT DOCUMENTS

| | | | |
|---|---|---|---|
| 5,998,292 A | 12/1999 | Black et al. | |
| 7,148,565 B2 | 12/2006 | Kim et al. | |
| 8,187,968 B2 * | 5/2012 | Boyd et al. | 438/618 |
| 2005/0269665 A1 | 12/2005 | Wylie et al. | |
| 2006/0223301 A1 | 10/2006 | Vanhaelemeersch et al. | |

OTHER PUBLICATIONS

Three-Dimensional Integrated Circuits, A.W. Topol, et al., *IBM Journal of Research and Development*, vol. 50, No. 4/5 (Jul./Sep. 2006).
U.S. Appl. No. 11/641,364, filed Dec. 18, 2006, Inventors: Yezdi Dordi, et al.
U.S. Appl. No. 11/641,361, filed Dec. 18, 2006, Inventors: Fritz Redeker, et al.
U.S. Appl. No. 11/821,051, filed Jun. 20, 2007, Inventors: John Boyd, et al.
U.S. Appl. No. 11/820,810, filed Jun. 20, 2007, Inventors: John Boyd, et al.
Notice of Allowance for U.S. Appl. No. 11/820,811, filed Jun. 20, 2007.
Notice of Allowance for U.S. Appl. No. 12/613,518, filed Nov. 5, 2009.

* cited by examiner

*Primary Examiner* — Michael Lebentritt
(74) *Attorney, Agent, or Firm* — Larry Williams; Williams IPS

(57) ABSTRACT

Presented are device structures and methods of fabricating three-dimensional integrated circuits that include post-contact back end of line through-hole via integration for the three-dimensional integrated circuits. Another aspect of the present invention includes three-dimensional integrated circuits fabricated according to methods of the present invention.

5 Claims, 19 Drawing Sheets

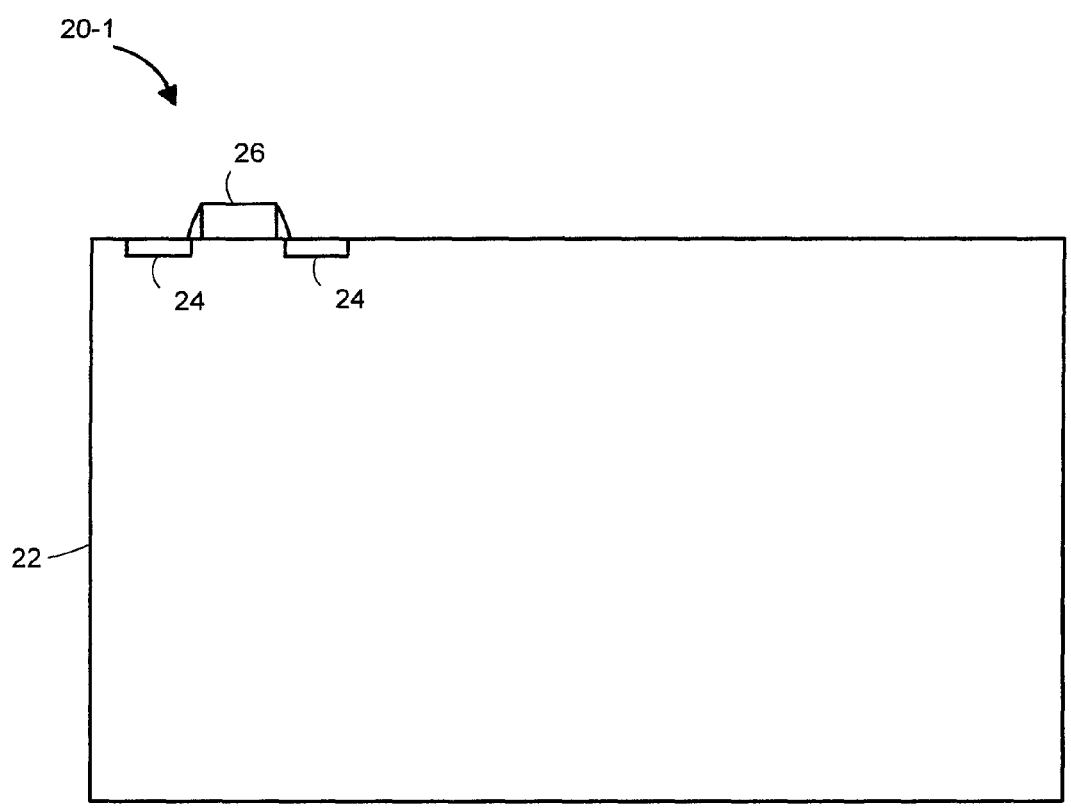
FIG. 2.1

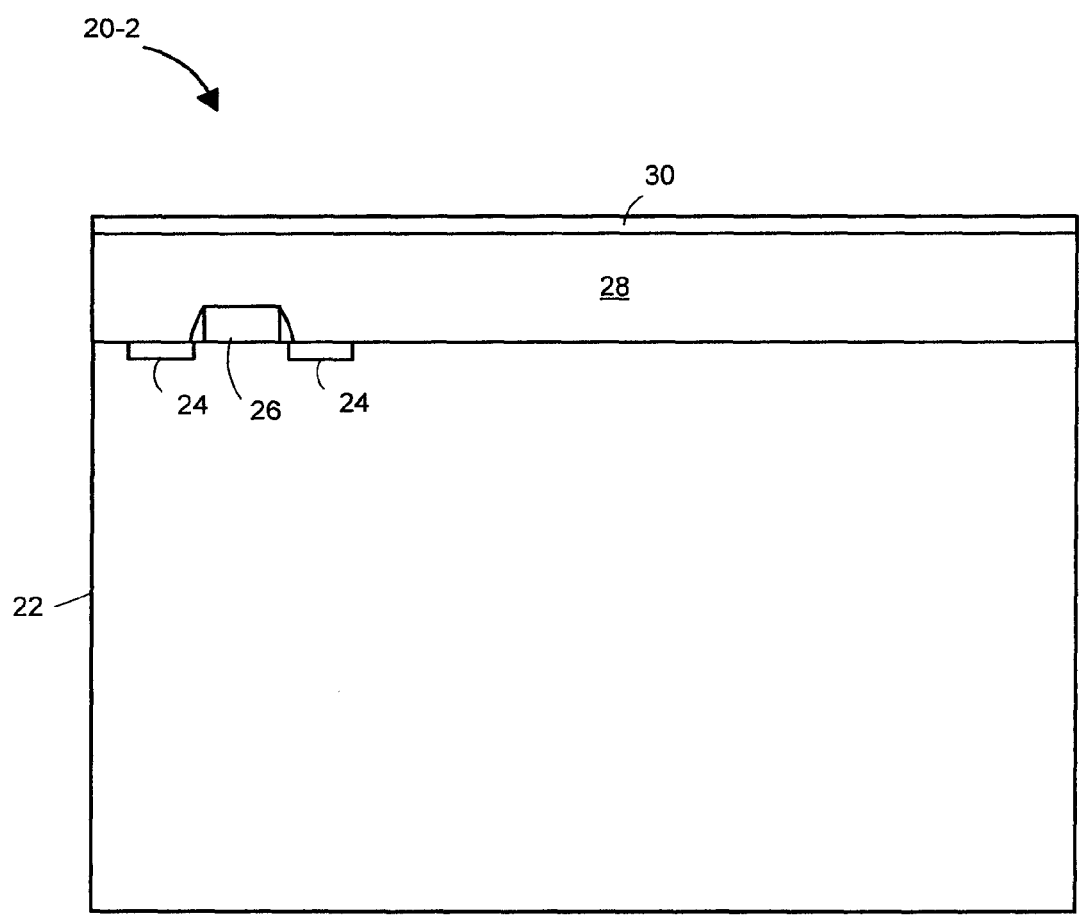
FIG. 2.2

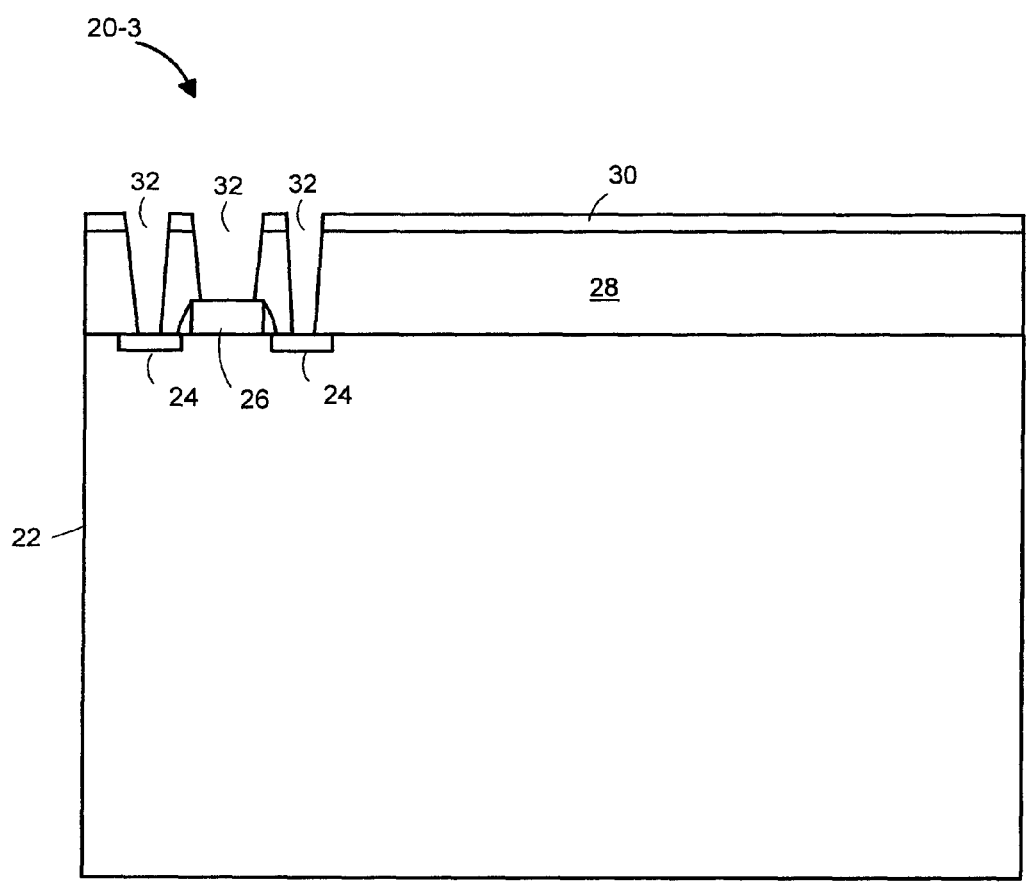
FIG. 2.3

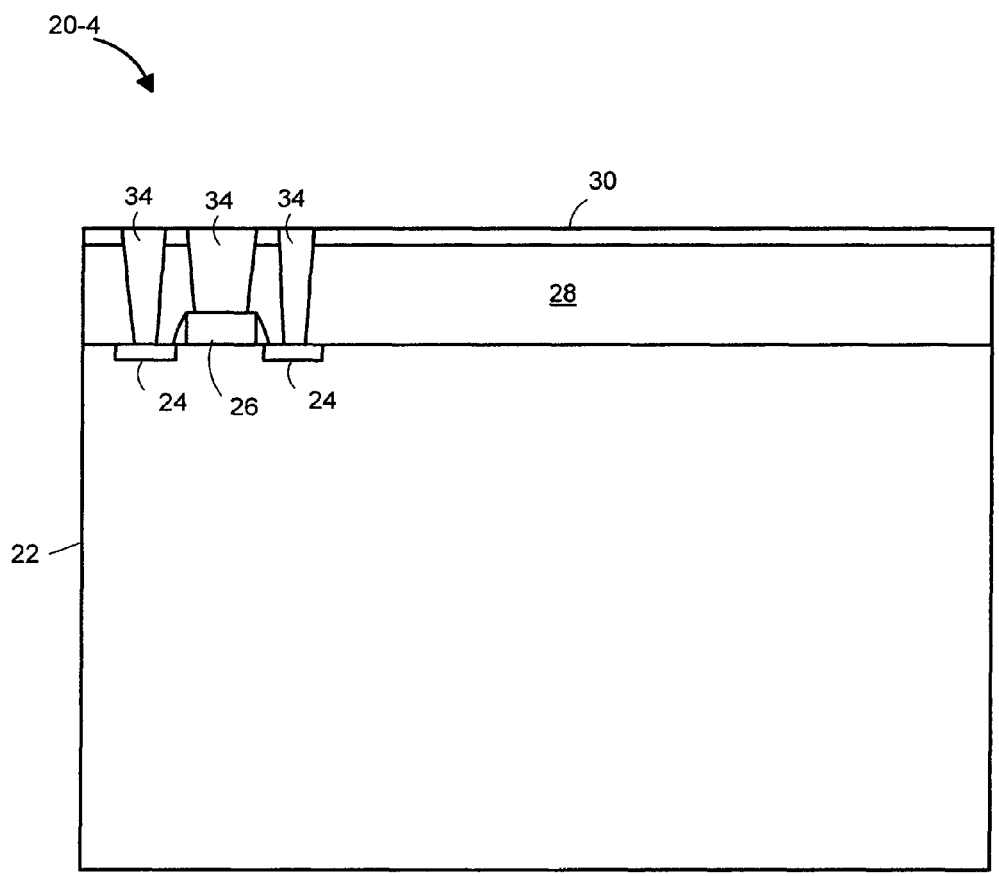
FIG. 2.4

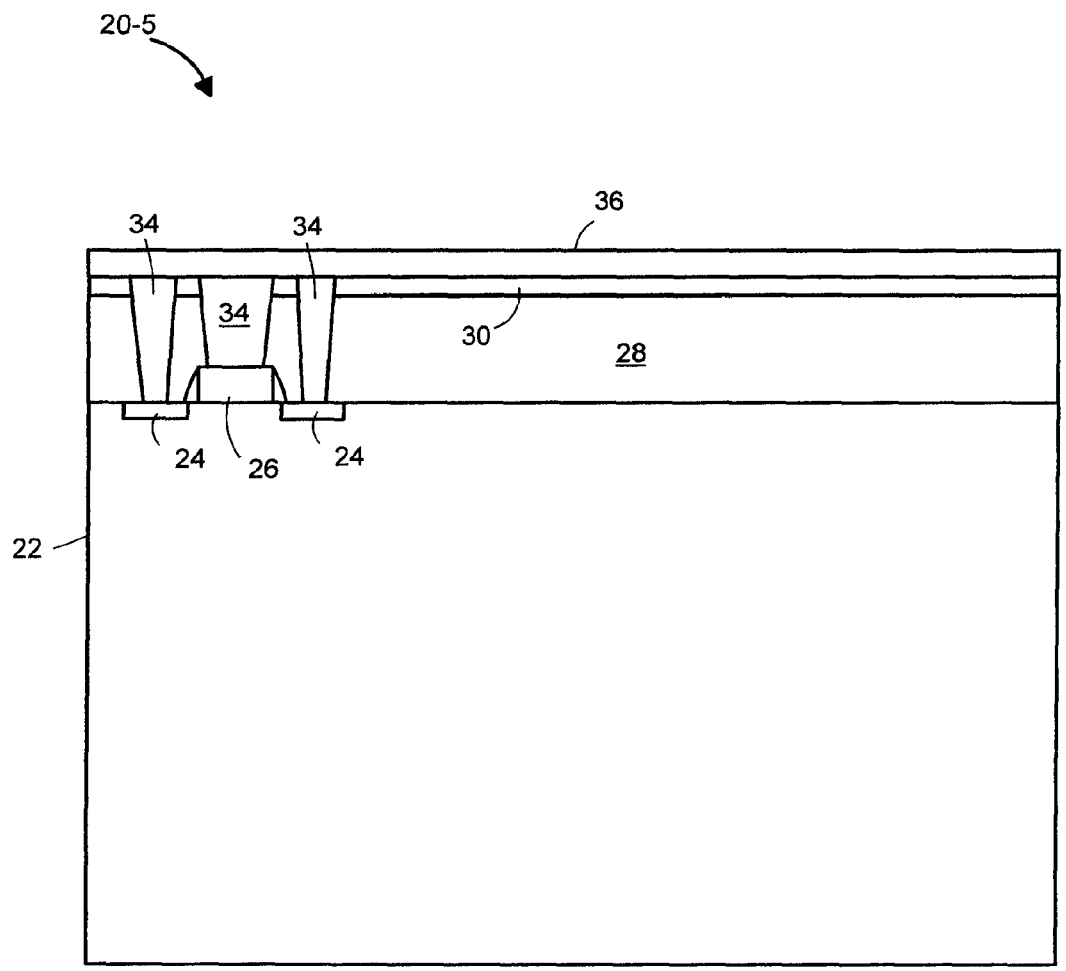
FIG. 2.5

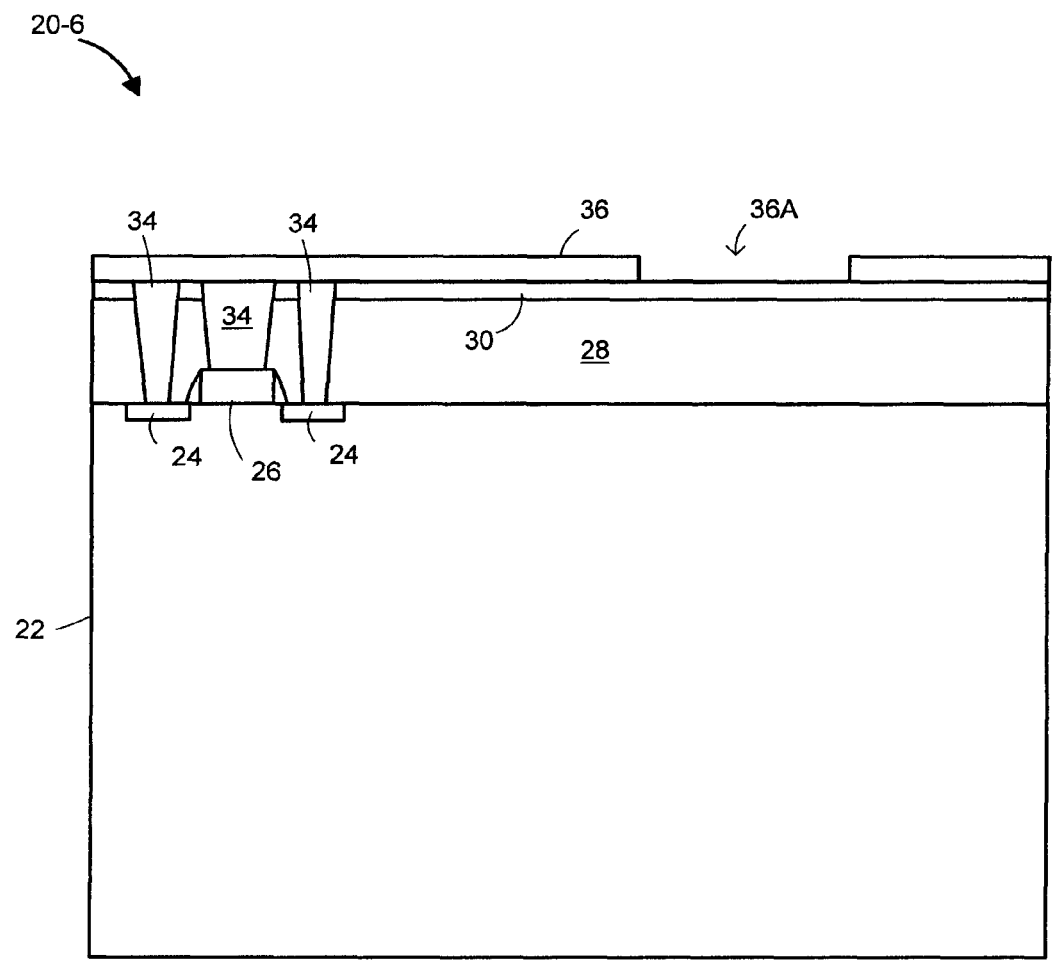
FIG. 2.6

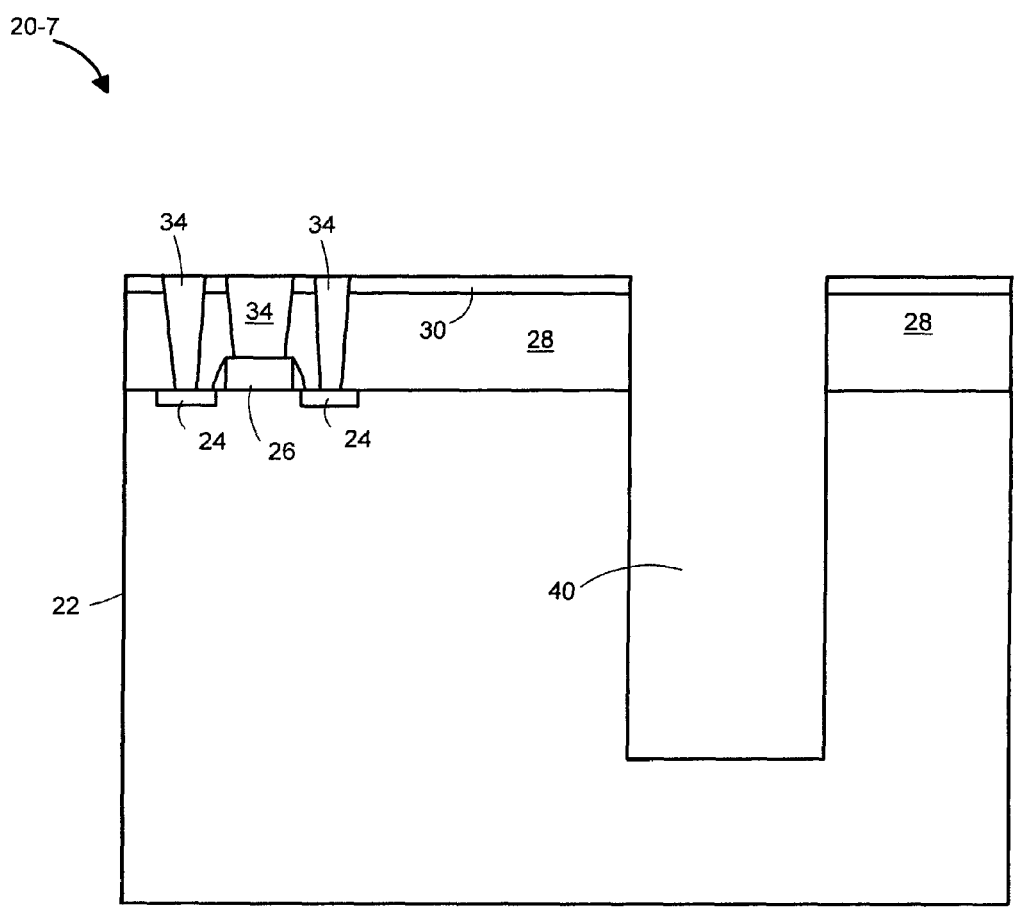
FIG. 2.7

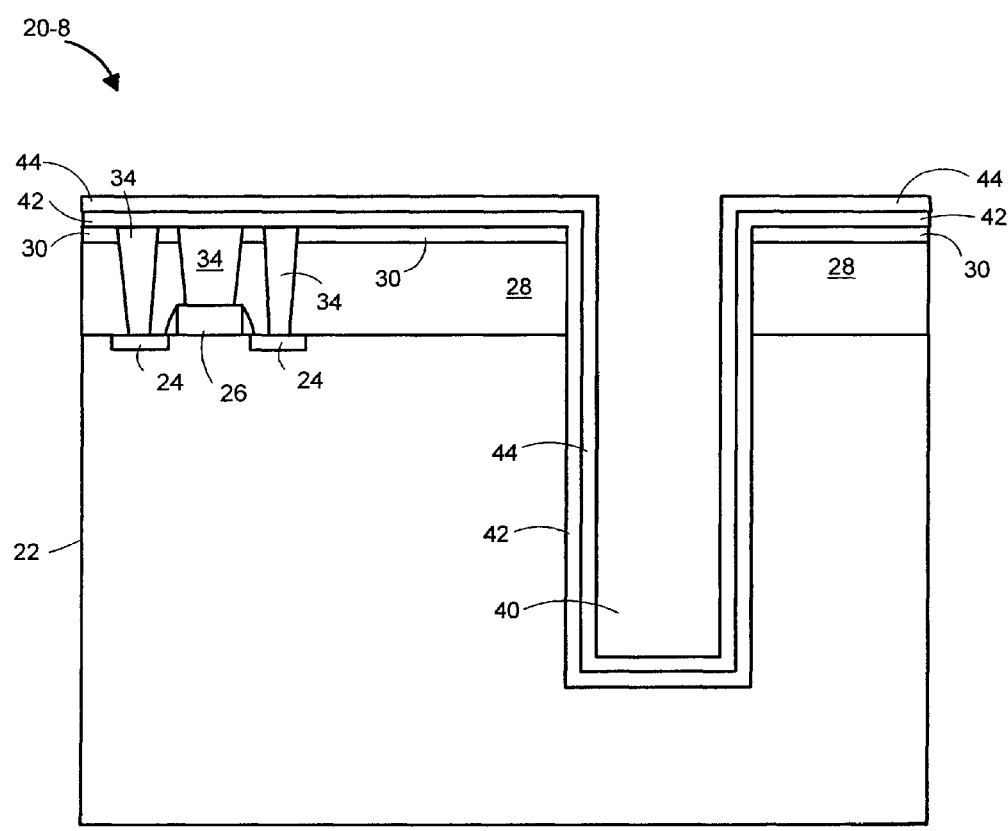
FIG. 2.8

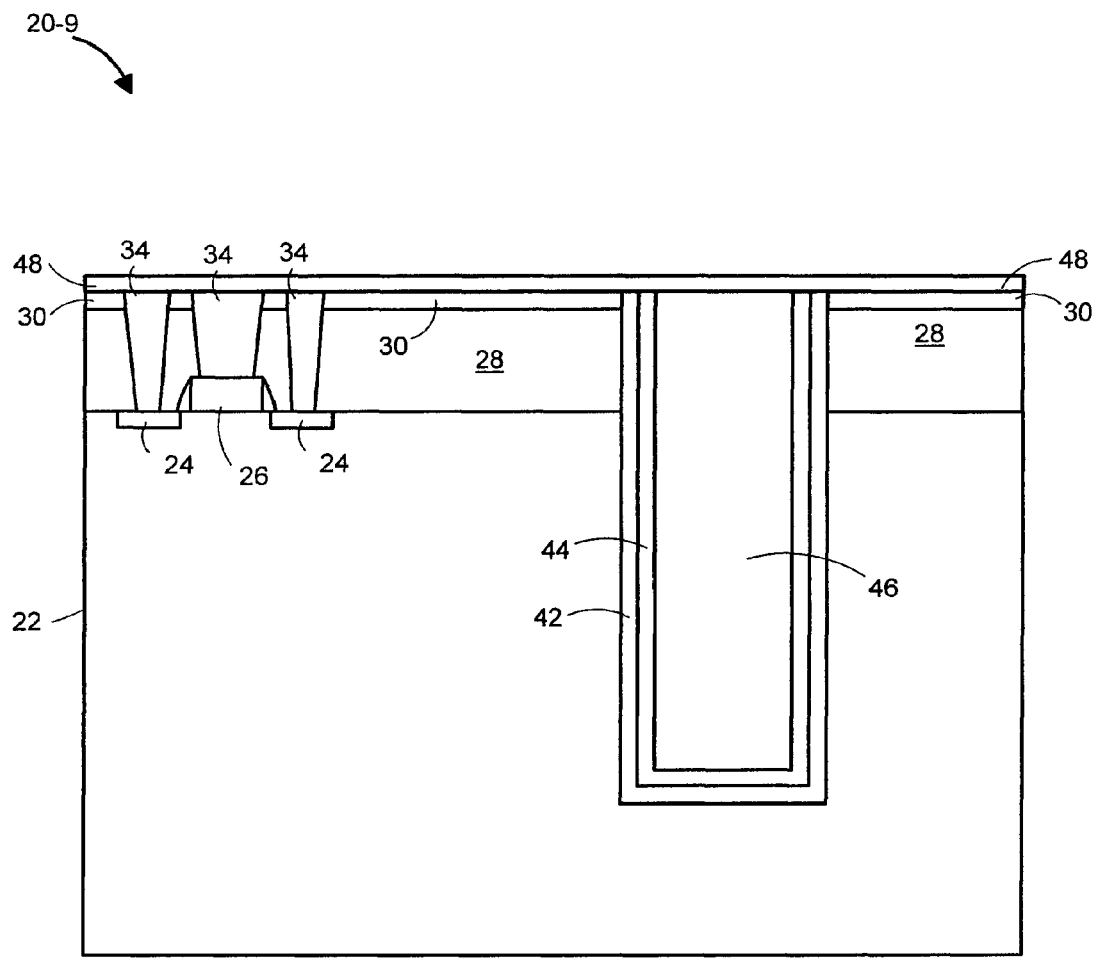
FIG. 2.9

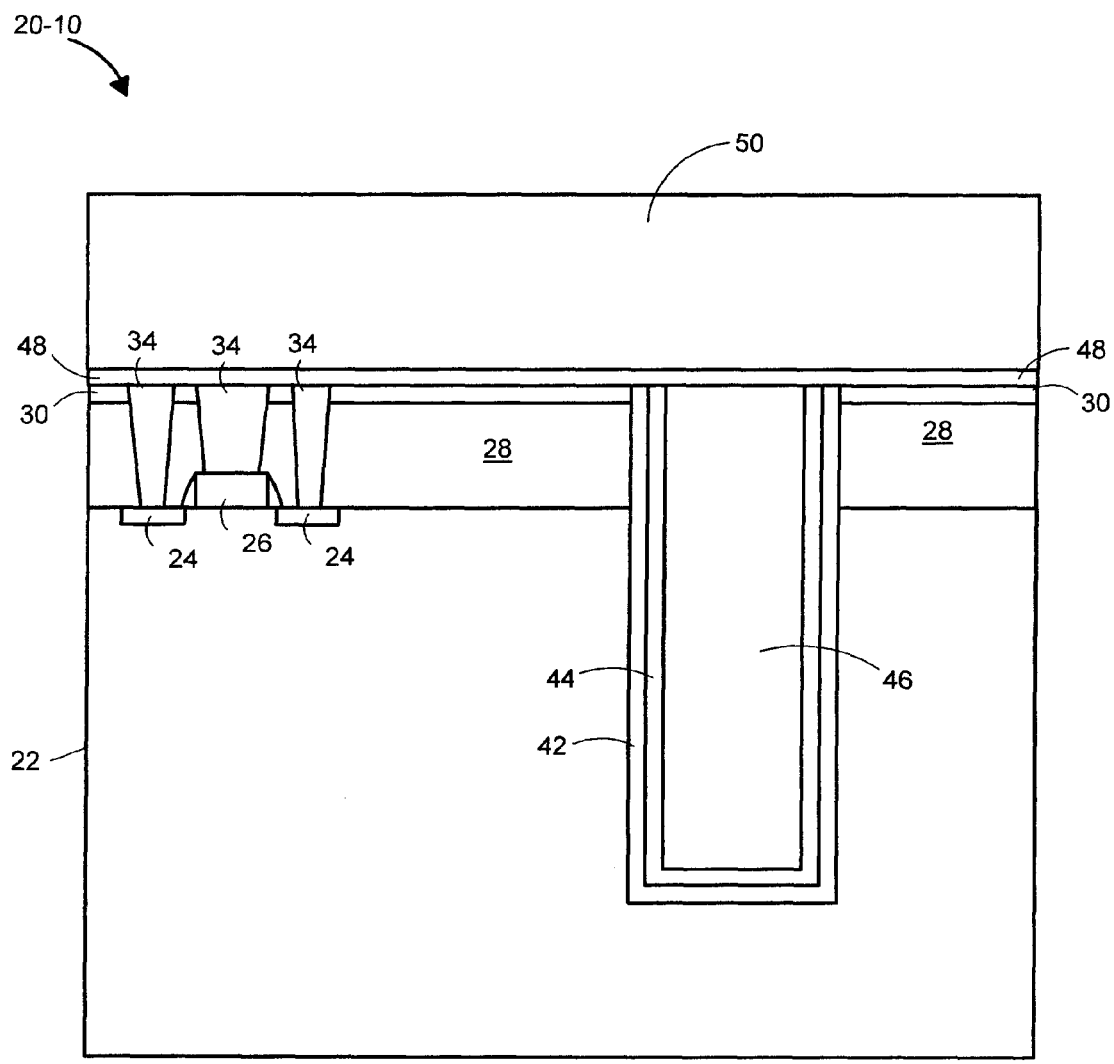
FIG. 2.10

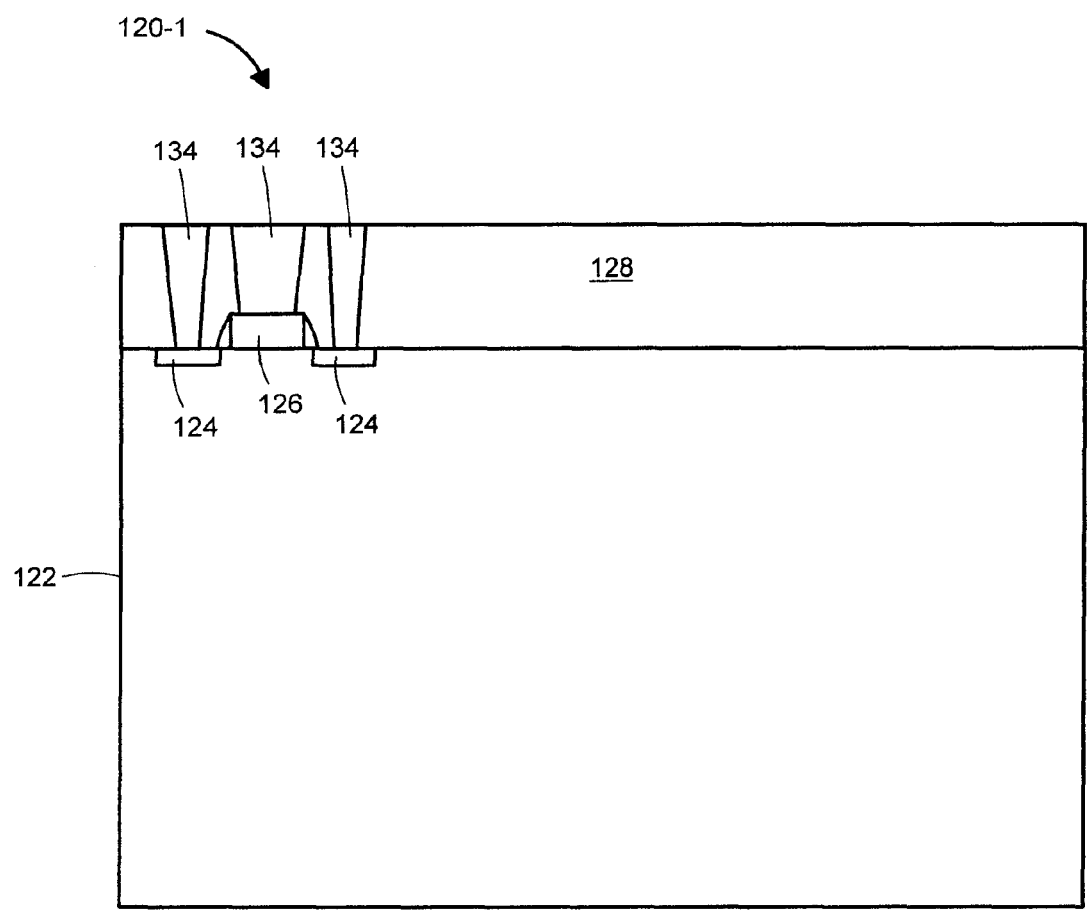
FIG. 4.1

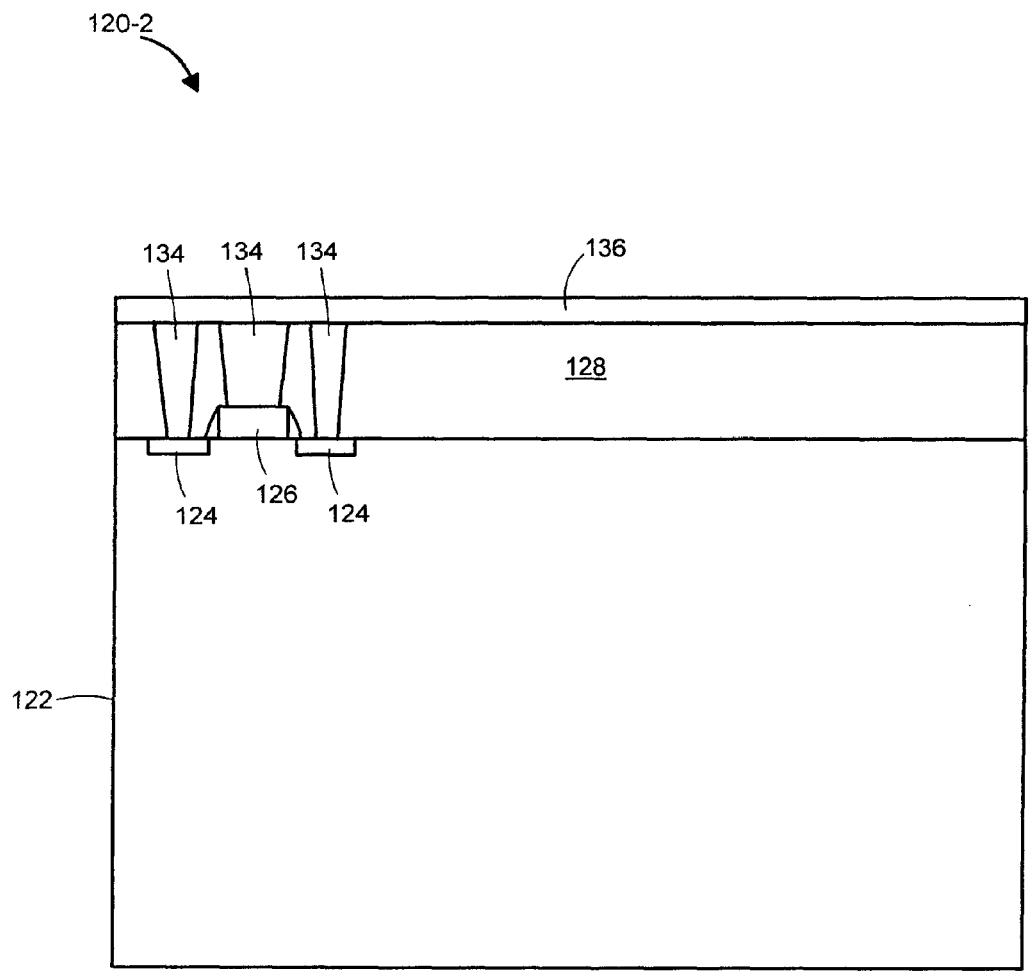
FIG. 4.2

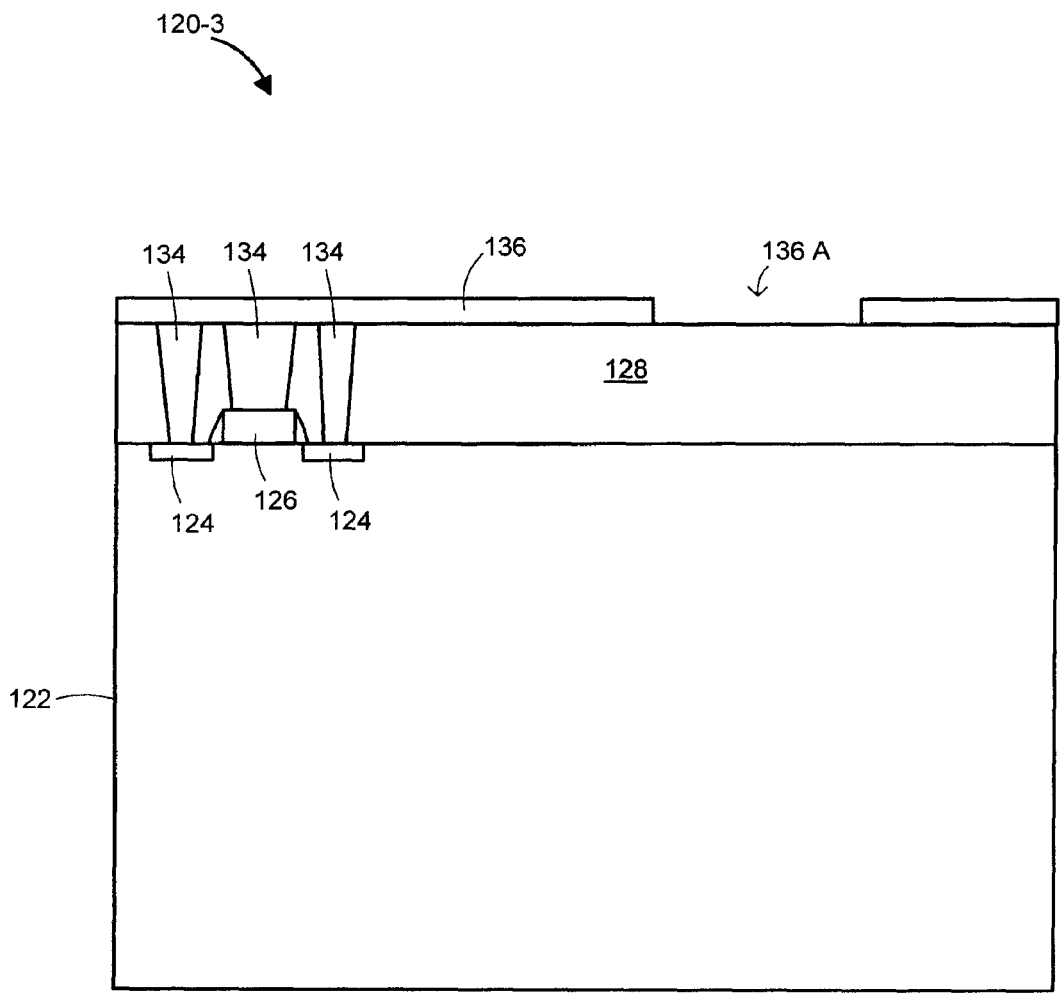
FIG. 4.3

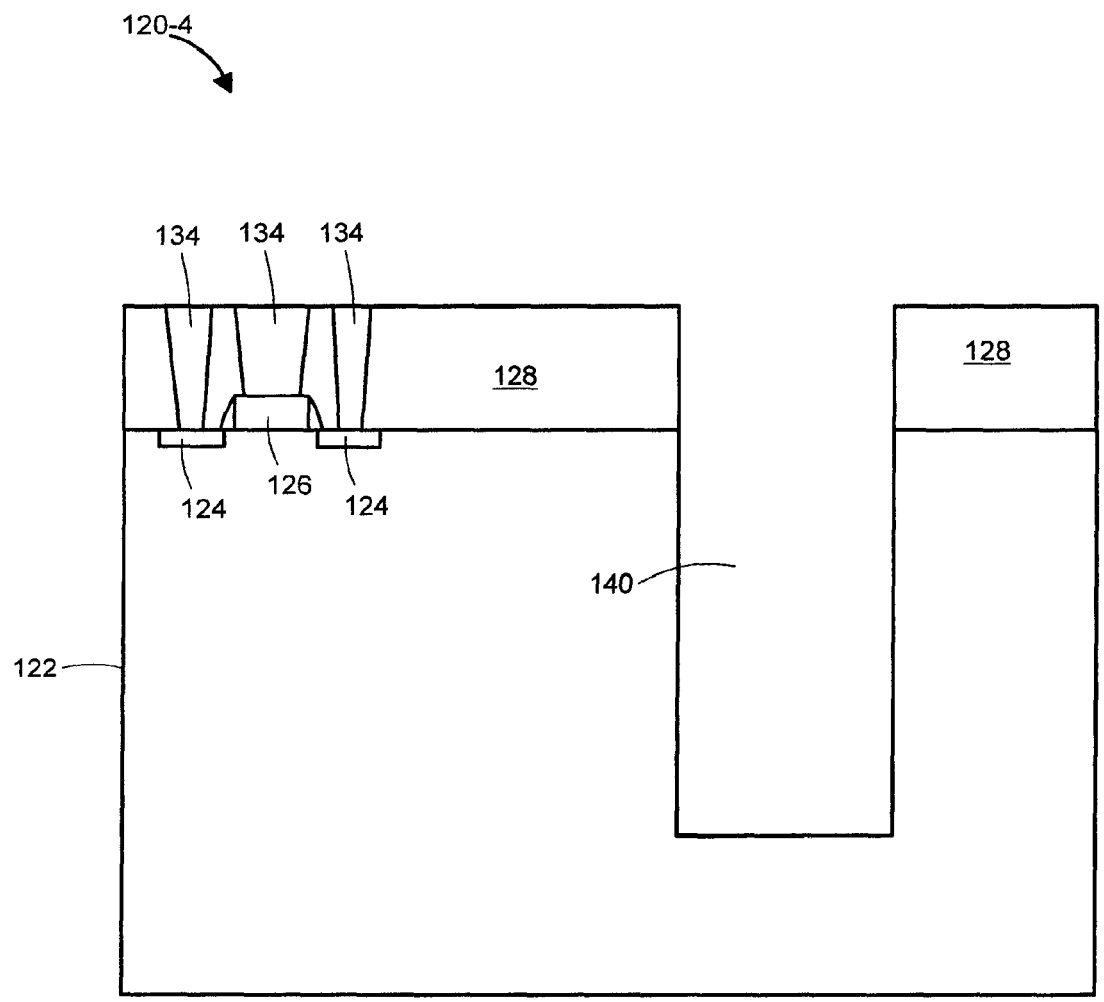
FIG. 4.4

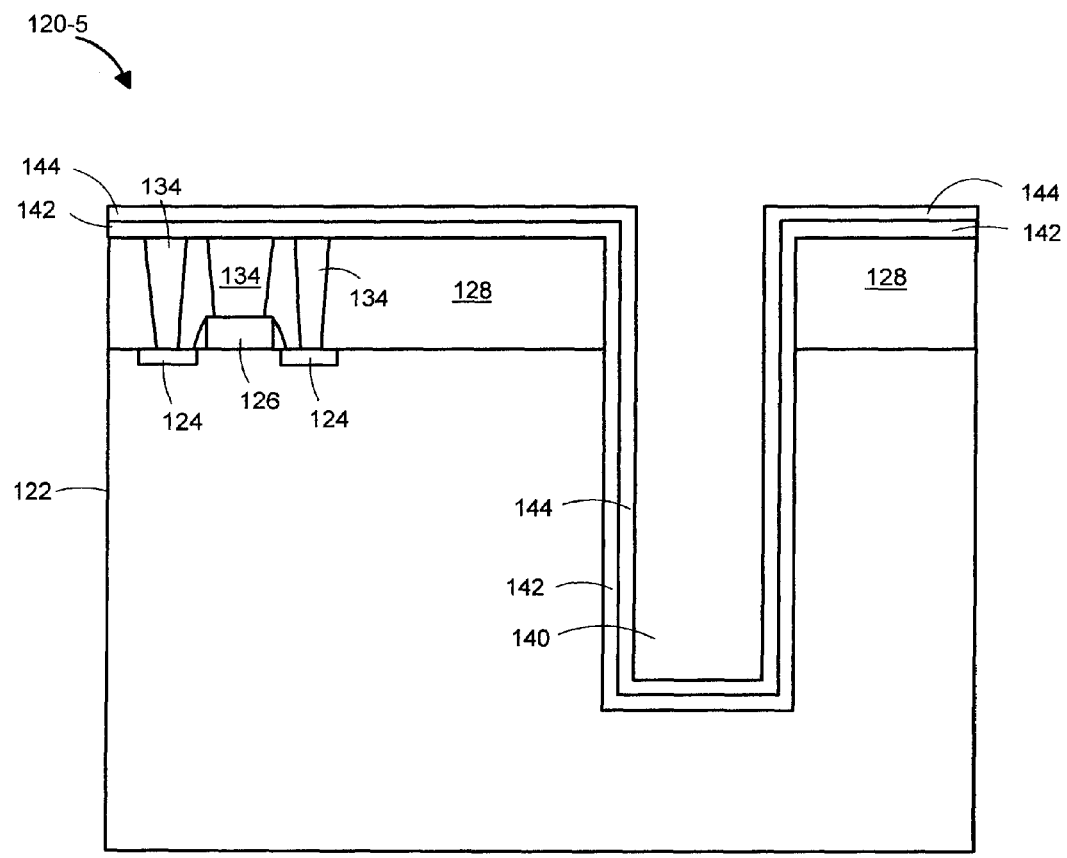
FIG. 4.5

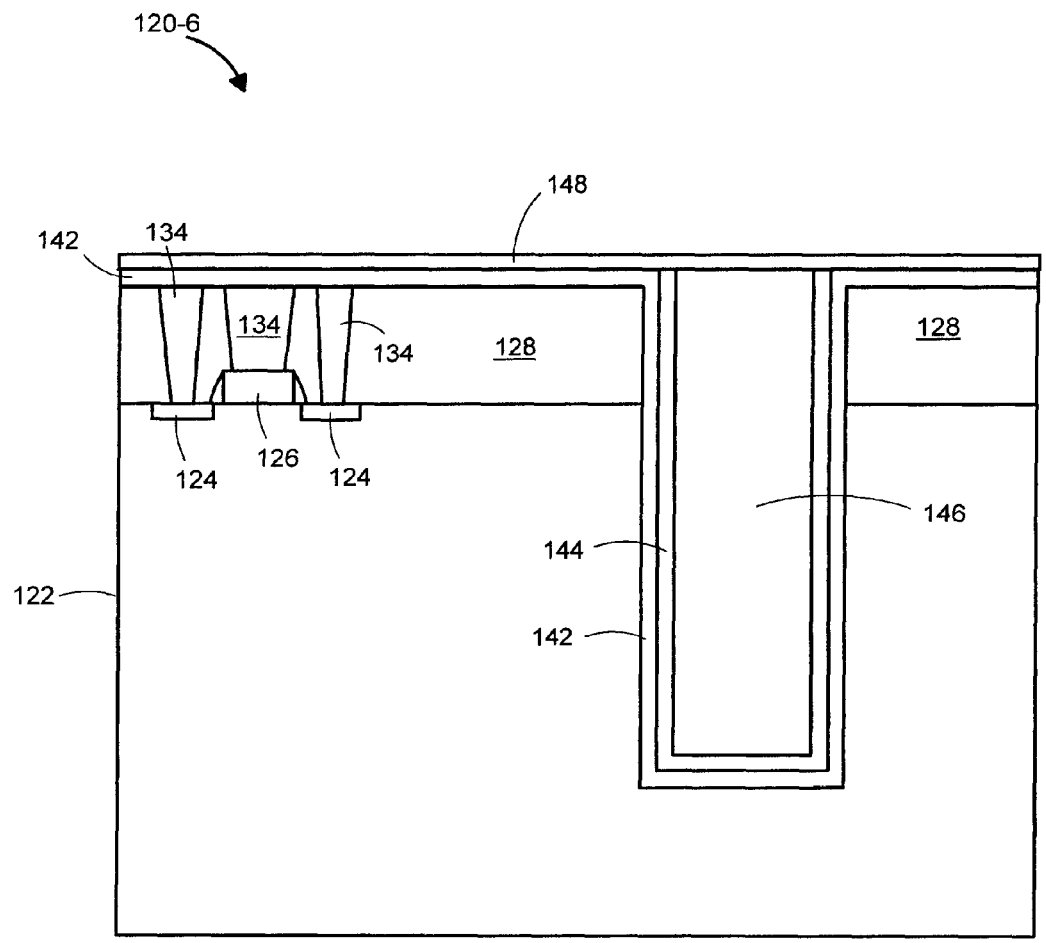
FIG. 4.6

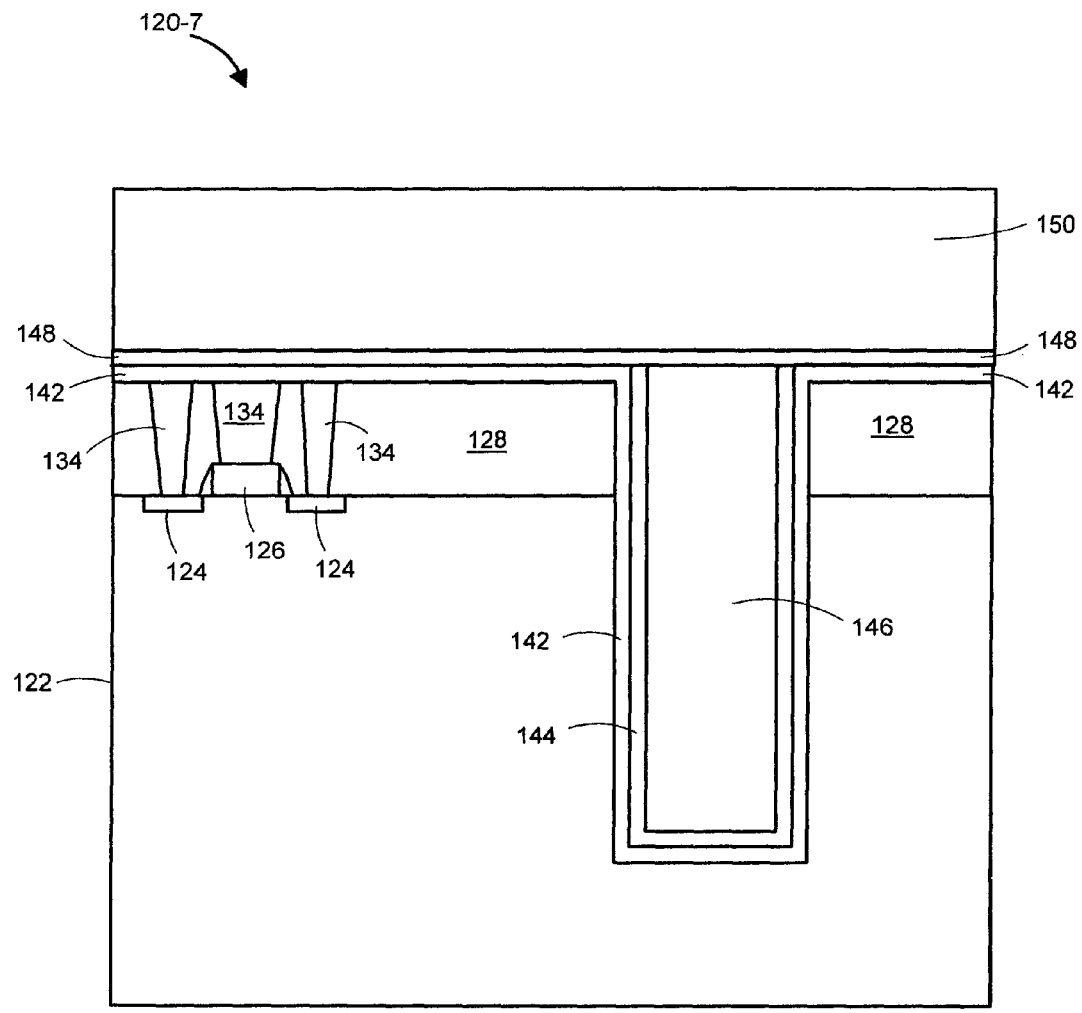
FIG. 4.7

DEVICE WITH POST-CONTACT BACK END OF LINE THROUGH-HOLE VIA INTEGRATION

CROSS REFERENCE

The present application is a divisional of U.S. patent application Ser. No. 12/613,518, filed Nov. 5, 2009 now U.S. Pat. No. 8,187,968, which is a divisional of U.S. patent application Ser. No. 11/820,811, to Boyd et al., filed Jun. 20, 2007, now U.S. Pat. No. 7,615,480. This application is related to U.S. Pat. No. 7,592,259; U.S. Pat. No. 7,749,893; U.S. patent application Ser. No. 11/821,051, to Boyd et al., filed Jun. 20, 2007; and U.S. patent application Ser. No. 11/820,810, to Boyd et al., filed Jun. 20, 2007. All of these patents and/or applications are incorporated herein, in their entirety, by this reference for all purposes.

BACKGROUND

This invention pertains to three dimensional integrated circuits and methods, of fabricating three-dimensional integrated circuits; more specifically this invention relates to methods of post-contact back end of line through-hole via integration for interconnect metallization for three-dimensional integrated circuits.

A three-dimensional integrated circuit includes two or more semiconductor chips with integrated circuits or includes two or more semiconductor wafers with integrated circuits. The semiconductor chips or semiconductor wafers are stacked together, bonded, and electrically interconnected in three dimensions, i.e., integrated within the semiconductor chips or semiconductor wafers and integrated between the semiconductor chips or semiconductor wafers. The interconnections between the chips or between the wafers are accomplished by way of through holes from the back side to the front side of one or more of the chips or one or more of the semiconductor wafers. In other words, the electrical connections between the stack of chips or stack of wafers are made by way of the through holes. Three-dimensional integrated circuits may have a large number of through holes for interconnect metallization between the semiconductor chips or between the semiconductor wafers.

Three-dimensional integrated circuits, according to some designs, will use through-hole vias that are large, high aspect ratio features with dimensions an order of magnitude or more larger than the minimum geometry features for standard technology dual damascene metallization interconnects. The through hole vias may require diameters of about 5-10 micrometers. The length for some of the through holes may be about 25 micrometers or more. Consequently, the aspect ratios for processing the through holes are extremely high in comparison to standard technologies for fabricating two-dimensional integrated circuits. Typical processes for fabricating two-dimensional integrated circuits cannot easily handle the large holes and extremely high aspect ratios that will be required for fabricating three-dimensional integrated circuits.

Furthermore, the process steps and process conditions required for forming the through hole vias to achieve three-dimensional integration are incompatible with many of the standard technology front end of line (FEOL) processes and standard back end of line (BEOL) processes used for the within wafer two-dimensional integration for fabricating semiconductor devices. Modifications to the standard FEOL processes and/or standard BEOL processes can be made but at what may be unacceptably high costs and risks. In other words, it is generally undesirable to manufacturers of semiconductor devices to develop and implement new processes. For some semiconductor fabrication processes, even minor modifications to the process can incur a substantial learning curve, which can be both time consuming and costly because of development costs and the tremendous costs associated with testing, process integration, and yield optimization.

Clearly, there is a need for device structures and processes for manufacturing substrates for three-dimensional integrated circuits that do not require extensive modifications to the standard technologies of FEOL processing or BEOL processing. The practical fabrication of three-dimensional integrated circuits will require new processes that can meet the requirements for metallization of three-dimensional integrated circuits. More specifically, there is a need for new processes capable of meeting the unusual aspect ratio requirements for through hole via metallization for three-dimensional integrated circuits while requiring little or no significant modifications to standard technology FEOL processes and BEOL processes used for the within wafer two-dimensional integration.

SUMMARY

This invention pertains to three-dimensional integrated circuits and methods of fabricating three-dimensional integrated circuits that include post-contact back end of line through-hole via integration for three-dimensional integrated circuits. The present invention seeks to overcome one or more of the deficiencies in the standard technologies for fabricating three-dimensional integrated circuits such as integrated stacks of semiconductor chips or semiconductor wafers with integrated circuits.

One aspect of the present invention is a method of processing substrates comprising a semiconductor for three-dimensional integrated circuits. In one embodiment, the method comprises forming metal plug contacts through a hard mask and a premetal dielectric to transistors in the semiconductor. The method also includes etching a hole for a through-hole via through the hard mask to the semiconductor using a patterned photoresist process, removing the patterned photoresist and using a hard mask process to etch the hole to an amount into the semiconductor. The method further includes depositing a dielectric liner to isolate the hole from the semiconductor, depositing a gapfill metal to fill the hole, and planarizing the surface of the substrate to the hard mask.

Another embodiment of the present invention is a method of processing substrates for three-dimensional integrated circuits. The method comprises forming metal plug contacts through a premetal dielectric to transistors in a semiconductor and etching a hole for a through-hole via through the premetal dielectric to an amount into the semiconductor. The method also includes depositing a dielectric liner to isolate the hole from the semiconductor, depositing a gapfill metal in the hole, and planarizing the surface of the substrate to the dielectric liner.

Another aspect of the present invention includes three-dimensional integrated circuits fabricated according to methods of the present invention.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

BRIEF DESCRIPTION OF THE DRAWINGS

FIG. 2.1 is a diagram of a substrate to be processed according to an embodiment of the present invention.

FIG. 2.2 is a diagram of a substrate partially processed according to an embodiment of the present invention.

FIG. 2.3 is a diagram of a substrate partially processed according to an embodiment of the present invention.

FIG. 2.4 is a diagram of a substrate partially processed according to an embodiment of the present invention.

FIG. 2.5 is a diagram of a substrate partially processed according to an embodiment of the present invention.

FIG. 2.6 is a diagram of a substrate partially processed according to an embodiment of the present invention.

FIG. 2.7 is a diagram of a substrate partially processed according to an embodiment of the present invention.

FIG. 2.8 is a diagram of a substrate partially processed according to an embodiment of the present invention.

FIG. 2.9 is a diagram of a substrate partially processed according to an embodiment of the present invention.

FIG. 2.10 is a diagram of a substrate processed according to an embodiment of the present invention.

FIG. 4.1 is a diagram of a substrate to be processed according to an embodiment of the present invention.

FIG. 4.2 is a diagram of a substrate partially processed according to an embodiment of the present invention.

FIG. 4.3 is a diagram of a substrate partially processed according to an embodiment of the present invention.

FIG. 4.4 is a diagram of a substrate partially processed according to an embodiment of the present invention.

FIG. 4.5 is a diagram of a substrate partially processed according to an embodiment of the present invention.

FIG. 4.6 is a diagram of a substrate partially processed according to an embodiment of the present invention.

FIG. 4.7 is a diagram of a substrate processed according to an embodiment of the present invention.

Figure 1:
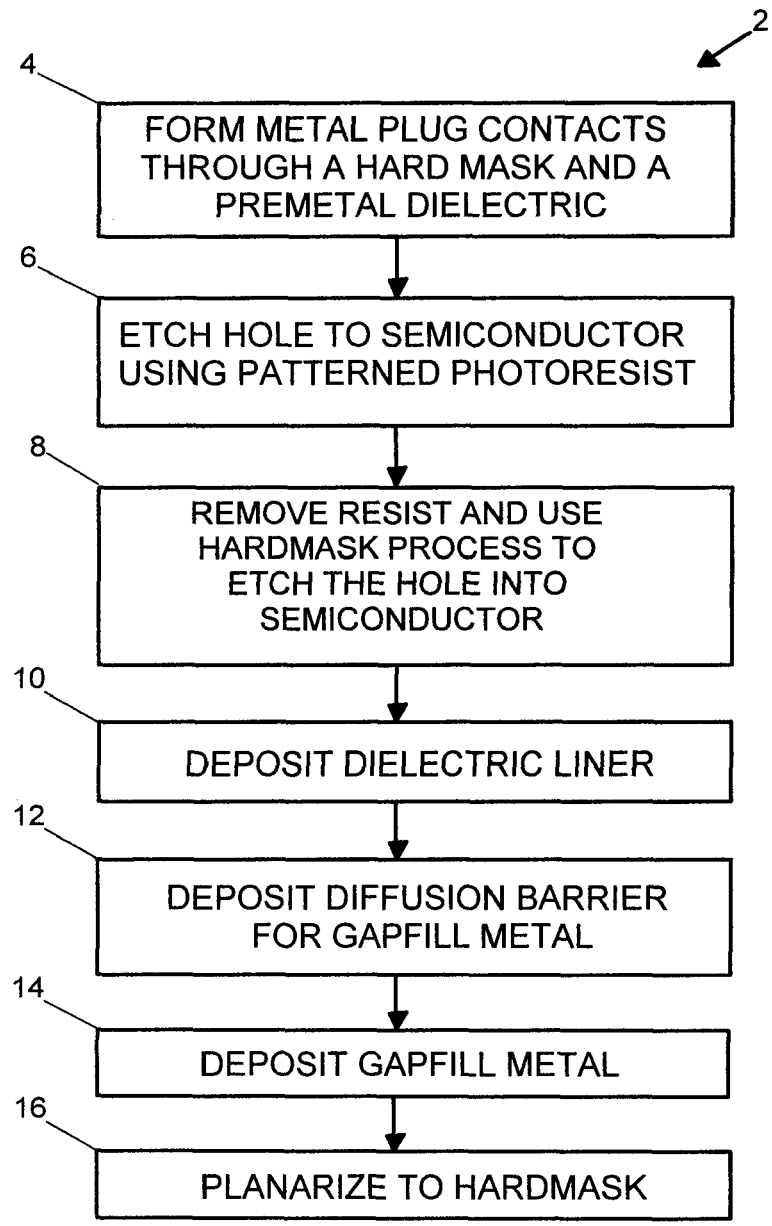
FIG. 1 is a process flow diagram of an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION

The present invention pertains to interconnect metallization for three-dimensional integrated circuits. More specifically, the present invention pertains to a process flow for forming holes and metal gapfill of the holes for through-hole vias for metallization lines running through a semiconductor wafer or other substrate. The metallization is usually used for the upper level semiconductor device substrates used in three-dimensional integrated circuits.

The operation of embodiments of the present invention will be discussed below, primarily, in the context of processing semiconductor wafers for use in stacked wafer three-dimensional integrated circuits. More specifically, the operation of embodiments of the present invention is discussed below in the context of processing silicon wafers for three-dimensional silicon integrated circuits. However, it is to be understood that embodiments in accordance with the present invention may be used for other semiconductor devices and other semiconductor wafers.

In the following description of the figures, identical reference numerals have been used when designating substantially identical elements or steps that are common to the figures.

Reference is now made to FIG. 1 where there is shown a process flow diagram 2 according to one embodiment of the present invention. Process flow diagram 2 shows a method of fabricating three-dimensional integrated circuits. More specifically, process flow diagram 2 shows substrate processing for the three-dimensional integrated circuits. Process flow diagram 2 includes step 4, step 6, step 8, step 10, step 12, step 14, and step 16.

Step 4 includes forming metal plug contacts through a hard mask and a premetal dielectric to electrically contact semiconductor transistors for the three-dimensional integrated circuits. Step 4 is performed on a substrate for a three-dimensional integrated circuit. The semiconductor transistors are incorporated as part of the substrate. The semiconductor transistors can be formed by techniques known to persons of ordinary skill in the art for forming transistors. Preferably, the transistors are formed using standard technology for front end of line (FEOL) processing of semiconductor devices from semiconductor wafers or other substrates having a suitable semiconductor for transistors.

The semiconductor wafer has a premetal dielectric applied over the transistors and the surface of a semiconductor wafer. The premetal dielectric can be any of the standard technology materials for premetal dielectrics used in standard technology FEOL processing of semiconductor transistors or other material suitable for use as a premetal dielectric. The premetal dielectric may comprise an electrically insulating material such as boron phosphorus silicon glass (BPSG) or other glass with suitable properties for a premetal dielectric.

The hard mask recited in step 4 comprises a material suitable for use as a hard mask for lithography purposes such as hard mask materials typically used in processing semiconductor devices. The hard mask is disposed as a layer over the premetal dielectric. Examples of some of the materials that can be used for the hard mask include, but are not limited to, silicon carbide and silicon carbon nitride.

According to a preferred embodiment of the present invention, step 4 includes etching contact vias through the hard mask and through the premetal dielectric. The metal plugs are formed in the contact vias to make electrical contact with the transistors. The metal plugs are planarized so that they are coplanar with the surface of the hard mask.

The metal plugs may comprise standard technology metal plugs such as tungsten plugs. As an option, the metal plugs may comprise copper metal plugs or metal plugs of other materials suitable for metal contacts to transistors. For copper metal plugs, the formation of the metal plugs may include one or more additional steps to provide a passivation coating or barrier for the copper.

Step 6 of process flow 2 includes etching a hole to the semiconductor using a patterned photoresist process. More specifically, a dry etch process such as plasma etching and reactive ion etching is performed using a patterned photoresist to etch through the hard mask and the premetal dielectric.

For some embodiments of the present invention, additional layers of dielectrics such as a dielectric for shallow trench isolation may be present between the premetal dielectric and the semiconductor. The additional dielectrics, if present, are also etched in step 6.

The patterned photoresist is lithographically patterned so that the areas of the substrate intended for placement of the hole are exposed for etching. The patterned photoresist etch process may include one or more processes typically used for etching dielectric materials such as the hard mask, the premetal dielectric, and the dielectric for shallow trench isolation. Suitable equipment and processes for performing the etch in step 6 are available from companies such as Lam Research Corporation of Fremont, Calif.

Step 8 includes removing the photoresist and using the hard mask with a hard mask process to etch the hole into the semiconductor. The hole formed in the semiconductor is a blind hole. Suitable equipment and processes for etching the semiconductor are available from companies such as Lam Research Corporation of Fremont, Calif. The hole is etched into the semiconductor to an amount so that the hole has a depth suitable for forming a through hole from the blind hole formed in step 8 by removing material from the backside of the substrate during later processing.

The dimensions of the hole formed in step 6 and step 8 are selected based on the design requirements for the three-dimensional integrated circuits. According to one embodiment of the present invention, the dimensions of the hole may include diameters in the range of 1-10 micrometers and depths of 25 micrometers to 40 micrometers, and all values, ranges, and subranges subsumed therein. For other embodiments of the present invention, the hole may have a diameter larger than 10 micrometers and may have a depth greater than 40 micrometers.

Step 10 of process flow 2 includes deposition of a dielectric liner. The dielectric liner is deposited over the surface of the substrate and the surfaces of the hole formed in step 6 and step 8. A variety of suitable dielectrics can be used for the dielectric liner. Some examples of materials that can be used for the dielectric liner include, but are not limited to, tetraethyl ortho silicate oxide, silicon carbide, silicon carbon nitride, carbon doped glass, aluminum oxide, and others.

Step 12 of process flow 2 includes depositing a metallization diffusion barrier for a gapfill metal. Step 12 may not be needed for some embodiments of the present invention. More specifically, the metallization diffusion barrier may not be needed if the dielectric liner deposited in step 10 is capable of preventing diffusion of the gapfill metal. However, for a preferred embodiment of the present invention, copper metallization is used. Preferably, a metallization diffusion barrier suitable for use with copper metallization is deposited in step 12. Examples of preferred metallization diffusion barriers for copper include, but are not limited to, tantalum, tantalum nitride, tantalum on tantalum nitride, and ruthenium on tantalum nitride. In a preferred embodiment of the present invention, the metallization diffusion barrier includes ruthenium on tantalum nitride with the ruthenium deposited by a process such as atomic layer deposition and the tantalum nitride deposited by a process such as atomic layer deposition.

Step 14 of process flow 2 includes depositing the gapfill metal. As indicated above, preferred embodiments for three-dimensional integrated circuits according to the present invention use copper metallization. Step 14 includes depositing copper as the gapfill metal. A variety of processes can be used for depositing the gapfill metal. Preferred processes for depositing copper for copper metallization include wet chemical processes such as electrochemical plating of copper and such as electroless deposition of copper. As an option for some embodiments of the present invention for copper gapfill, a copper seed layer may also be deposited prior to depositing the gapfill copper.

Step 16 of process flow 2 includes planarization of the surface of the substrate to the hard mask. The planarization is done to remove excess materials on the surface of the substrate such as overburden from the gapfill metal deposition and other layers and to uncover the metal plugs. After the planarization, the surface of the metal plugs and the surface of the gapfill metal in the hole are coplanar. This means that making electrical contacts to the metal plugs and to the gapfill metal in the hole is more easily accomplished because vias etched to make the electrical contacts to the metal plugs and to the gapfill metal require substantially the same amount of etching.

Additional process steps following step 16 may include steps such as providing a passivation or barrier layer over the gapfill metal, if needed. Further processing of the substrates include any additional steps needed to form one or more metallization levels using standard technologies for BEOL processing of semiconductor devices. In general, process flow 2 allows the FEOL processes to be carried out without major modification of standard practices for FEOL processing. Similarly, process flow 2 allows the BEOL processes to be carried out without major modification of standard practices for BEOL processing. In other words, process flow 2 allows formation of structures for through hole metallization for three-dimensional integrated circuits without substantial modification of standard practices for FEOL and BEOL processing.

Substrates processed according to process flow 2 will have additional process steps to convert the metal filled blind hole into a through hole for a metallization via. According to preferred embodiments of the present invention, the through hole is formed by removing material from the back side of the substrate to open the bottom of the hole formed in step 6 and step 8. The removal of the material from the backside of the substrate can be accomplished using one or more or a combination of known processes such as grinding, etching, and chemical mechanical planarization. Standard processing practices can be used for vertical stacking and interconnection of the substrates into three-dimensional integrated circuits.

To further illustrate the process flow presented in FIG. 1, reference is now made to FIG. 2.1 through FIG. 2.10 where there is shown a cross sectional side view of a section of a device wafer 20-1 to be processed (shown in FIG. 2.1) and as being processed (shown in FIG. 2.2 through FIG. 2.10) according to process flow 2 in FIG. 1. Device wafer 20-1 includes a substrate 22 comprising a semiconductor having a transistor that includes source drain regions 24 and a gate 26 as commonly used in semiconductor device technologies. Optionally, substrate 22 may be a semiconductor wafer such as a silicon wafer with doped areas to form source drain regions 24. Alternatively, substrate 22 may comprise an insulating material such as sapphire or glass supporting a layer of a semiconductor such as silicon.

FIG. 2.2 shows a device wafer 20-2. Device wafer 20-2 includes device wafer 20-1 having a premetal dielectric 28 and a layer of a hard mask 30. Premetal dielectric 28 may comprise an electrically insulating material such as boron phosphorus silicon glass (BPSG) or other glass with suitable properties for a premetal dielectric used in FEOL processing. Hard mask 30 is disposed over premetal dielectric 28.

Examples of some of the materials that can be used for hard mask 30 include, but are not limited to, silicon carbide and silicon carbon nitride.

FIG. 2.3 shows a device wafer 20-3 which includes device wafer 20-2 having contact vias 32 etched through hard mask 30 and premetal dielectric 28 for the formation of contact plugs. Contact vias 32 can be etched using standard technology etch processes such as plasma etching and reactive ion etching.

FIG. 2.4 shows a device wafer 20-4 which includes a device wafer 20-3 having metal plugs 34 contacting source drain regions 24 and gate 26. Metal plugs 34 are formed in contact vias 32 and are planarized so that they are coplanar with the surface of hard mask 30. Metal plugs 34 may comprise standard technology metal plugs such as tungsten plugs. As an option, the metal plugs may comprise copper metal plugs or metal plugs of other materials suitable for metal contacts to transistors. For copper metal plugs, the formation of metal plugs 34 may include one or more additional steps to provide a passivation coating or barrier over the surface of the copper.

FIG. 2.5 shows a device wafer 20-5 which includes device wafer 20-4 having a photoresist layer 36 applied to the surface. FIG. 2.6 shows a device wafer 20-6 including device wafer 20-5 with photoresist layer 36 having a patterned area 36A for etching. More specifically, photoresist layer 36 is used with a photoresist etch process to etch through hard mask 30 and premetal dielectric 28. If additional layers of dielectric are present before reaching the semiconductor, then those additional layers of dielectric can also be etched using the photoresist etch process. Examples of some additional dielectric layers that may need to be etched include dielectric layers for shallow trench isolation and dielectrics for semiconductor on insulator structures. After etching through the dielectrics, photoresist layer 36 can be removed and a hard mask etch process can be used to continue etching into the semiconductor.

FIG. 2.7 shows a device wafer 20-7 which includes device wafer 20-6 after completion of the etch processing. More specifically, photoresist 36 has been removed and device wafer 20-7 has a hole 40 to be used for formation of a through hole via. Hole 40 has been formed by etching through hard mask 30, premetal dielectric 28, any additional dielectric layers that may be present in some device structures (additional dielectric layers not shown in FIG. 2.7), and into the semiconductor. Hole 40 has been etched to the depth desired so that hole 40 can be converted into a through hole via during later processing steps for fabrication of the three-dimensional integrated circuit. According to one embodiment of the present invention, the dimensions of hole 40 may include diameters in the range of 1-10 micrometers and depths of 25 micrometers to 40 micrometers, and all values, ranges, and subranges subsumed therein. For other embodiments of the present invention, the hole may have a diameter larger than 10 micrometers and a depth greater than 40 micrometers.

FIG. 2.8 shows a device wafer 20-8 which includes device wafer 20-7 with a dielectric liner 42 deposit over the surface of device wafer 20-7 including hole 40. Dielectric liner 42 is deposited so as to provide electrical isolation between the semiconductor and the metallization to be formed in hole 40. A variety of suitable dielectrics can be used for dielectric liner 42. Some examples of materials that can be used for dielectric liner 42 include, but are not limited to, tetraethyl ortho silicate oxide, silicon carbide, silicon carbon nitride, carbon doped glass, aluminum oxide, and others.

FIG. 2.8 also shows device wafer 20-8 having a metallization diffusion barrier 44 deposited over dielectric liner 42. Metallization diffusion barrier 44 may not be needed for some embodiments of the present invention. More specifically, the metallization diffusion barrier may not be needed if dielectric liner 42 is also capable of preventing diffusion of the gapfill metal. This means that metallization diffusion barrier 44 may be optional for some embodiments of the present invention. However, for a preferred embodiment of the present invention, copper metallization is used. Preferably, metallization diffusion barrier 44 is included so as to be suitable for use with copper metallization. Examples of preferred metallization diffusion barriers for copper include, but are not limited to, tantalum, tantalum nitride, tantalum on tantalum nitride, and ruthenium on tantalum nitride. In a preferred embodiment of the present invention, metallization diffusion barrier 44 includes ruthenium on tantalum nitride with the ruthenium deposited by a process such as atomic layer deposition and the tantalum nitride deposited by a process such as atomic layer deposition.

FIG. 2.9 shows a device wafer 20-9 which includes device wafer 20-8 further processed to include gapfill metal 46. After deposition of gapfill metal 46, further process steps include planarization to the surface of hard mask 30. The planarization is performed so as to remove overburden metal that may have been formed during deposition of gapfill metal 46 and to remove the portions of the barrier layer 44 and portions of dielectric liner 42 that were deposited outside of hole 40. The planarization makes the surface of gapfill metal 46 coplanar with the surface of hard mask 30 and metal plugs 34. For a preferred embodiment of the present invention, gapfill metal 46 comprises copper for copper metallization. FIG. 2.9 further shows device wafer 20-9 having a sealing layer 48 provided so as to at least isolate gapfill metal 46 from areas of the semiconductor device that could be harmed by contamination with gapfill metal 46, as can occur for copper metallization. Furthermore, for embodiments of the present invention that include using copper for metal plugs 34, sealing layer 48 can provide isolation for metal plugs 34.

A variety of options is available for the material and configuration for sealing layer 48. As one option, sealing layer 48 may comprise a diffusion barrier material such as, but not limited to, silicon carbide, silicon carbon nitride, silicon nitride, and other dielectric materials with sufficient diffusion barrier properties. Alternatively, sealing layer 48 may comprise a barrier layer for copper metallization such as a selectively applied layer of cobalt tungsten boron phosphide or other material with sufficient copper diffusion barrier properties. Embodiments of the present invention that include sealing layer 48 selectively applied to the metallization will not include a continuous layer for sealing layer 48 as shown in FIG. 2.9.

FIG. 2.10 shows a device wafer 20-10 which includes device wafer 20-9 and BEOL structure 50. BEOL structure 50 includes one or more metallization levels formed to interconnect the transistors and gapfill metal 46. As an option, BEOL structure 50 may be formed using standard technology BEOL processes for multiple level metallization for electronic devices. Further processing of electronic devices from device wafer 20-10 may include process steps to remove material from the backside of the substrate 22 so as to open the bottom of hole 40 to form a through hole. Still further processing includes stacking and interconnecting device wafer 20-10 with another device wafer to form a three-dimensional integrated circuit. Alternatively, two or more of device wafer 20-10 may be stacked and interconnected to form a three-dimensional integrated circuit. As another option, two or more of device wafer 20-10 may be stacked and interconnected with another wafer to form a three-dimensional integrated circuit.

Figure 3:
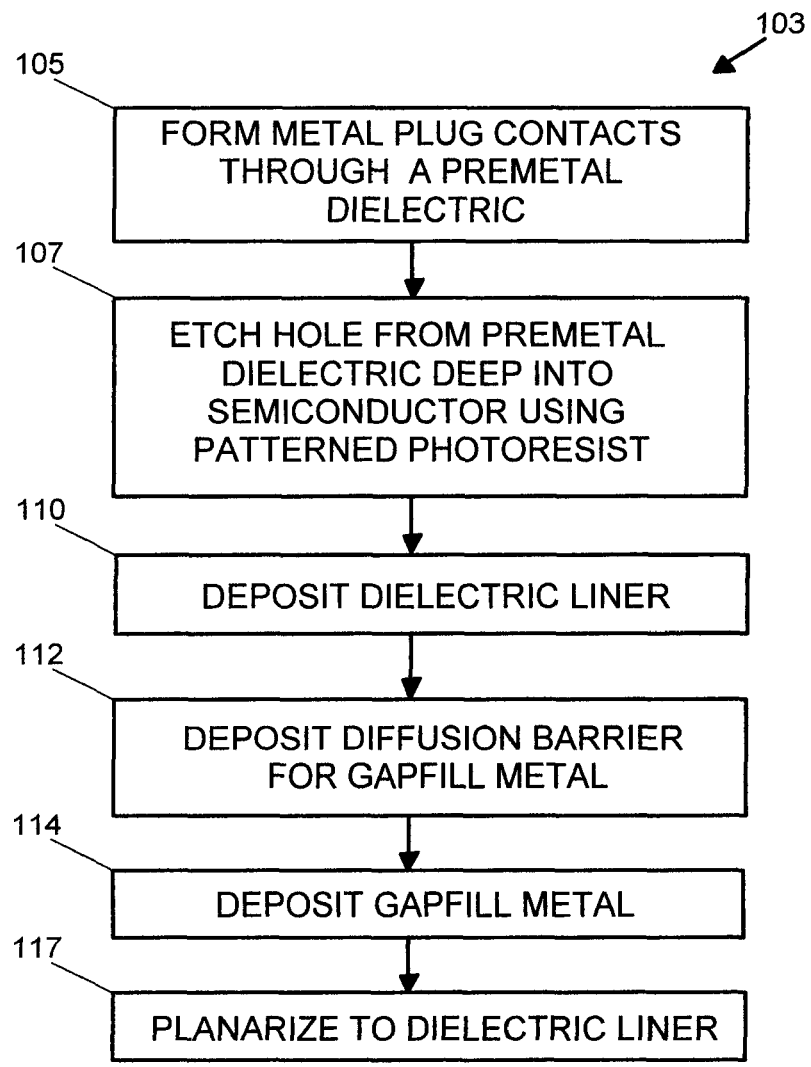
FIG. 3 is a process flow diagram of an embodiment of the present invention.

Reference is now made to FIG. 3 where there is shown a process flow diagram 103 according to another embodiment of the present invention. Process flow diagram 103 shows a method of fabricating three-dimensional integrated circuits. More specifically, process flow diagram 103 shows substrate processing for the three-dimensional integrated circuits. Process flow diagram 103 includes step 105, step 107, step 110, step 112, step 114, and step 117.

Step 105 includes forming metal plug contacts through a premetal dielectric to electrically contact semiconductor transistors for the three-dimensional integrated circuits. Step 105 is performed on a substrate for a three-dimensional integrated circuit. The semiconductor transistors are incorporated as part of the substrate. The semiconductor transistors can be formed by techniques known to persons of ordinary skill in the art for forming transistors. Preferably, the transistors are formed using standard technology for FEOL processing of semiconductor devices from semiconductor wafers or other substrates having a suitable semiconductor for transistors.

The semiconductor wafer has a premetal dielectric applied over the transistors and the surface of a semiconductor wafer. The premetal dielectric can be any of the standard technology materials for premetal dielectrics used in standard technology front end of line processing of semiconductor transistors or other material suitable for use as a premetal dielectric. The premetal dielectric may comprise an electrically insulating material such as boron phosphorus silicon glass or other glass with suitable properties for a premetal dielectric.

According to a preferred embodiment of the present invention, step 105 includes etching contact vias through the premetal dielectric for the metal plugs to contact the transistors. The metal plugs are formed in the contact vias and are planarized so that they are coplanar with the surface of the premetal dielectric. The metal plugs may comprise standard technology metal plugs such as tungsten plugs. As an option, the metal plugs may comprise copper metal plugs or metal plugs of other materials suitable for metal contacts to transistors. For copper metal plugs, the formation of the metal plugs may include one or more additional steps to provide a passivation coating or barrier for the copper.

Step 107 of process flow 103 includes etching a hole to the semiconductor using a patterned photoresist process. More specifically, a dry etch process such as plasma etching and reactive ion etching is performed using a patterned photoresist to etch through the premetal dielectric and deep into the semiconductor. For some embodiments of the present invention additional layers of dielectrics such as a dielectric for shallow trench isolation and a dielectric for semiconductor on insulator structures may be present between the premetal dielectric and the semiconductor. The additional dielectrics, if present, are also etched in step 107.

The patterned photoresist is lithographically patterned so that the areas of the substrate for placement of the hole are exposed for etching. The patterned photoresist etch process may include one or more processes typically used for etching dielectric materials such as the premetal dielectric, the dielectric for shallow trench isolation, the dielectric for semiconductor on insulator structures (if present), and the semiconductor. Suitable equipment and processes for performing the etching in step 107 are available from companies such as Lam Research Corporation of Fremont, Calif.

The dimensions of the hole formed in step 107 are selected based on the design requirements for the three-dimensional integrated circuits. According to one embodiment of the present invention, the dimensions of the hole may include diameters in the range of 1-10 micrometers and depths of 25 micrometers to 40 micrometers, and all values, ranges, and subranges subsumed therein. For other embodiments of the present invention, the hole may have a diameter larger than 10 micrometers and may have a depth greater than 40 micrometers.

Step 110 of process flow 103 includes deposition of a dielectric liner. The dielectric liner is deposited over the surface of the substrate and the surfaces of the hole formed in step 107. A variety of suitable dielectrics can be used for the dielectric liner. Some examples of materials that can be used for the dielectric liner include, but are not limited to, tetraethyl ortho silicate oxide, silicon carbide, silicon carbon nitride, aluminum oxide, carbon doped glass, and others. The dielectric liner is deposited so as to provide electrical isolation for the semiconductor.

Step 112 of process flow 103 includes depositing a metallization diffusion barrier for a gapfill metal. Step 112 may not be needed for some embodiments of the present invention. More specifically, the metallization diffusion barrier may not be needed if the dielectric liner deposited in step 110 is capable of preventing diffusion of the gapfill metal. However, for a preferred embodiment of the present invention, copper metallization is used. Preferably, a metallization diffusion barrier suitable for use with copper metallization is deposited in step 112. Examples of preferred metallization diffusion barriers for copper include, but are not limited to, tantalum, tantalum nitride, tantalum on tantalum nitride, and ruthenium on tantalum nitride. In a preferred embodiment of the present invention, the metallization diffusion barrier includes ruthenium on tantalum nitride with the ruthenium deposited by a process such as atomic layer deposition and the tantalum nitride deposited by a process such as atomic layer deposition.

Step 114 of process flow 103 includes depositing the gapfill metal. As indicated above, preferred embodiments for three-dimensional integrated circuits according to the present invention use copper metallization. Step 114 includes depositing copper as the gapfill metal. A variety of processes can be used for depositing the gapfill metal. Preferred processes for depositing copper for copper metallization include wet chemical processes such as electrochemical plating of copper and such as electroless deposition of copper. As an option for some embodiments of the present invention for copper gapfill, a copper seed layer may also be deposited prior to depositing the gapfill copper.

Step 117 of process flow 103 includes planarization of the surface of the substrate to the dielectric liner. The planarization is done to remove excess materials on the surface of the substrate such as overburdened from the gapfill metal deposition and other layers so that the only the dielectric liner remains over the metal plugs. After the planarization, the surface of the gapfill metal is coplanar with the surface of the dielectric liner.

Additional process steps following step 117 may include steps such as providing a passivation or barrier layer over the gapfill metal, if needed. Further processing of the substrates include any additional steps needed to form one or more metallization levels using standard technologies for BEOL processing of semiconductor devices. In general, process flow 103 allows the FEOL processes to be carried out without major modification of standard practices for FEOL processing. Similarly, process flow 103 allows the BEOL processes to be carried out without major modification of standard practices for BEOL processing. In other words, process flow 103 allows formation of structures for through hole metallization for three-dimensional integrated circuits without substantial modification of standard practices for FEOL and BEOL processing.

Substrates processed according to process flow 103 will have additional process steps to convert the metal filled blind hole into a through hole via for metallization. According to preferred embodiments of the present invention, the through hole is formed by removing material from the backside of the substrate to open the bottom of the hole formed in step 107. The removal of the material from the backside of the substrate maybe accomplished using one or more or a combination of known processes such as grinding, etching, and chemical mechanical planarization. Standard processing practices can be used for vertical stacking and interconnection of the substrates into three-dimensional integrated circuits.

To further illustrate the process flow presented in FIG. 3, reference is now made to FIG. 4.1 through FIG. 4.7 where there is shown a cross sectional side view of a section of a device wafer being processed (shown in FIG. 4.1 through FIG. 4.7) according to process flow 103 in FIG. 3. FIG. 4.1 shows a device wafer 120-1 having a substrate 122 comprising a semiconductor having a transistor that includes source drain regions 124 and a gate 126 as commonly used in semiconductor device technologies. Optionally, substrate 122 may be a semiconductor wafer such as a silicon wafer with doped areas to form source drain regions 124. Alternatively, substrate 122 may comprise an insulating material such as sapphire or glass supporting a layer of a semiconductor such as silicon.

Device wafer 120-1 includes a premetal dielectric 128. Premetal dielectric 128 may comprise an electrically insulating material such as boron phosphorus silicon glass or other glass with suitable properties for a premetal dielectric used in FEOL processing. FIG. 4.1 shows device wafer 120-1 having contact vias etched through premetal dielectric 128. Device wafer 120-1 also includes metal plugs 134 formed in the contact vias so as to electrically contact source drain regions 124 and gate 126. Metal plugs 134 are planarized so that they are coplanar with the surface of premetal dielectric 128. Metal plugs 134 may comprise standard technology metal plugs such as tungsten plugs. As an option, metal plugs 134 may comprise copper metal plugs or metal plugs of other materials suitable for electrical contacts to transistors. For copper metal plugs, the formation of metal plugs 134 may include one or more additional steps to provide a passivation coating or barrier for the copper. The contact vias can be etched using standard technology etch processes such as plasma etching and reactive ion etching.

FIG. 4.2 shows a device wafer 120-2 which includes device wafer 120-1 having a photoresist layer 136 applied to the surface. FIG. 4.3 shows a device wafer 120-3 including device wafer 120-2 with photoresist layer 136 having a patterned area 136A for etching. More specifically, photoresist layer 136 is used with a photoresist etch process to etch through premetal dielectric 128. If additional layers of dielectric are present before reaching the semiconductor, then those additional layers of dielectric can also be etched using the photoresist etch process. Examples of some additional dielectric layers that may need to be etched include dielectric layers for shallow trench isolation and dielectrics for semiconductor on insulator structures.

FIG. 4.4 shows a device wafer 120-4 which includes device wafer 120-3 after completion of the etch processing. More specifically, photoresist 136 has been removed and device wafer 120-4 has a hole 140 to be used for formation of a through hole via. Hole 140 has been formed by etching through premetal dielectric 28, any additional dielectric layers that may be present in some device structures (additional dielectric layers not shown in FIG. 4.4) and into the semiconductor. Hole 140 has been etched to the depth desired so that hole 140 can be converted into a through hole via during later processing steps for fabrication of the three-dimensional integrated circuit. According to one embodiment of the present invention, the dimensions of hole 140 may include diameters in the range of 1-10 micrometers and depths of 25 micrometers to 40 micrometers, and all values, ranges, and subranges subsumed therein. For other embodiments of the present invention, the hole may have a diameter larger than 10 micrometers and a depth greater than 40 micrometers.

FIG. 4.5 shows a device wafer 120-5 which includes device wafer 120-4 and a dielectric liner 142 deposited over the surface of device wafer 120-4 including hole 140. Dielectric liner 142 is deposited so as to provide electrical isolation between the semiconductor and the metallization to be formed in hole 140. A variety of suitable dielectrics can be used for dielectric liner 142. Some examples of materials that can be used for dielectric liner 42 include, but are not limited to, tetraethyl ortho silicate oxide, silicon carbide, silicon carbon nitride, carbon doped glass, aluminum oxide, and others.

FIG. 4.5 also shows device wafer 120-5 having a metallization diffusion barrier 144 deposited over dielectric liner 142. Metallization diffusion barrier 144 may not be needed for some embodiments of the present invention. More specifically, metallization diffusion barrier 144 may not be needed if dielectric liner 142 is also capable of preventing diffusion of the gapfill metal. This means that metallization diffusion barrier 144 may be optional for some embodiments of the present invention. However, for a preferred embodiment of the present invention, copper metallization is used. Preferably, metallization diffusion barrier 144 is included so as to be suitable for use with copper metallization. Examples of preferred metallization diffusion barriers for copper include, but are not limited to, tantalum, tantalum nitride, tantalum on tantalum nitride, and ruthenium on tantalum nitride. In a preferred embodiment of the present invention, metallization diffusion barrier 144 includes ruthenium on tantalum nitride with the ruthenium deposited by a process such as atomic layer deposition and the tantalum nitride deposited by a process such as atomic layer deposition.

FIG. 4.6 shows a device wafer 120-6 which includes device wafer 120-5 further processed to include a gapfill metal 146. After deposition of gapfill metal 146, further process steps include planarization to the surface of dielectric liner 142 disposed outside of hole 140. The planarization is performed so as to remove overburden metal that may have been formed during deposition of gapfill metal 146 and to remove the portions of barrier layer 144 that were deposited outside of hole 140. The planarization makes the surface of gapfill metal 146 coplanar with dielectric liner 142 over metal plugs 134. For a preferred embodiment of the present invention, gapfill metal 146 comprises copper for copper metallization. FIG. 4.6 further shows device wafer 120-6 having a sealing layer 148 provided so as to at least isolate gapfill metal 146 from areas of the semiconductor device that could be harmed by contamination with gapfill metal 146, as can occur for copper metallization.

A variety of options is available for the material and configuration for sealing layer 148. As one option, sealing layer 148 may comprise a diffusion barrier material such as, but not limited to, silicon carbide, silicon carbon nitride, silicon nitride, and other dielectric materials with sufficient diffusion barrier properties. Alternatively, sealing layer 148 may comprise a barrier layer for copper metallization such as a selectively applied layer of cobalt tungsten boron phosphide or other material with sufficient copper diffusion barrier properties. Embodiments of the present invention that include sealing layer 148 selectively applied to the metallization will not include a continuous layer for sealing layer 148 as shown in FIG. 4.6.

FIG. 4.7 shows a device wafer 120-7 which includes device wafer 120-6 and BEOL structure 150. BEOL structure 150 includes one or more metallization levels formed to interconnect the transistors and gapfill metal 146. As an option, BEOL structure 150 may be formed using standard technology BEOL processes for multiple level metallization for electronic devices. Further processing of electronic devices from device wafer 120-7 may include process steps to remove material from the backside of the substrate 122 so as to open the bottom of hole 140 to form a through hole. Still further processing includes stacking and interconnecting device wafer 120-7 with another device wafer to form a three-dimensional integrated circuit. Alternatively, two or more of device wafer 120-7 may be stacked and interconnected to form a three-dimensional integrated circuit. As another option, two or more of device wafer 120-7 may be stacked and interconnected with another wafer to form a three-dimensional integrated circuit.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Further, unless expressly stated to the contrary, "at least one of" is to be interpreted to mean "one or more." For example, a process, method, article, or apparatus that comprises one or more of a list of elements and if one or more of the elements comprises a sub-list of sub-elements, then the sub-elements are to be considered in the same manner as the elements. For example, at least one of A and B is satisfied by any one of the following: A is true (or present) and B is false (or not present), A is false (or not present) and B is true (or present), and both A and B are true (or present).

What is claimed is:

1. A microelectronic device comprising:
    at least one substrate having semiconductor transistors formed therein, the substrate having at least one hole for a through hole via;
    a pre-metal dielectric formed over the semiconductor transistors;
    a hard mask over the pre-metal dielectric;
    metal plugs formed through the hard mask and the pre-metal dielectric to electrically contact the transistors;
    a gapfill metal in the at least one hole, the gapfill metal being planarized so that the metal plugs and the gapfill metal are substantially coplanar with the top surface of the hard mask.

2. The microelectronic device of claim 1, wherein the substrate comprises a silicon wafer, the gapfill metal comprises copper, the metal plugs comprise copper, and the hard mask comprises silicon carbide or silicon carbon nitride.

3. The microelectronic device of claim 1, wherein the substrate comprises a silicon wafer, the gapfill metal comprises copper, the metal plugs comprise tungsten, and the hard mask comprises silicon carbide or silicon carbon nitride.

4. The microelectronic device of claim 1, further comprising a dielectric liner substantially surrounding the gapfill metal.

5. The microelectronic device of claim 1, further comprising a diffusion barrier for the gapfill metal substantially surrounding the gapfill metal.

\* \* \* \* \*